(12) United States Patent
Okamoto et al.

(10) Patent No.: US 8,743,446 B2
(45) Date of Patent: Jun. 3, 2014

(54) DISPLAY DEVICE AND METHOD FOR MANUFACTURING THE SAME

(75) Inventors: Masataka Okamoto, Chosei-gun (JP); Hidekazu Nitta, Chiba (JP); Jun Fujiyoshi, Mobara (JP)

(73) Assignee: Pixtronix, Inc., San Diego, CA (US)

( * ) Notice: Subject to any disclaimer, the term of this patent is extended or adjusted under 35 U.S.C. 154(b) by 69 days.

(21) Appl. No.: 13/483,077

(22) Filed: May 30, 2012

(65) Prior Publication Data

US 2012/0307331 A1 Dec. 6, 2012

(30) Foreign Application Priority Data

Jun. 2, 2011 (JP) ................................. 2011-124625

(51) Int. Cl.
*G02B 26/02* (2006.01)

(52) U.S. Cl.
USPC ........................................................ 359/228

(58) Field of Classification Search
CPC ............................ G02B 26/004; G02B 26/005
USPC ........................................ 359/227, 228, 296
See application file for complete search history.

(56) References Cited

U.S. PATENT DOCUMENTS

| | | |
|---|---|---|
| 2006/0152474 A1 | 7/2006 | Saito et al. |
| 2006/0250325 A1 | 11/2006 | Hagood et al. |
| 2008/0037104 A1 | 2/2008 | Hagood et al. |
| 2008/0174846 A1* | 7/2008 | Morozumi et al. ........... 359/228 |
| 2010/0027100 A1 | 2/2010 | Lee et al. |

FOREIGN PATENT DOCUMENTS

| | | |
|---|---|---|
| JP | H11133446 A | 5/1999 |
| JP | 2008-197668 | 8/2008 |
| KR | 20070117599 A | 12/2007 |
| WO | WO 2006/091738 A1 | 8/2006 |

OTHER PUBLICATIONS

European Search Report—EP12169402—Search Authority—Munich—Sep. 19, 2012.

* cited by examiner

*Primary Examiner* — Euncha Cherry
(74) *Attorney, Agent, or Firm* — Edward A. Gordon; Foley & Lardner LLP

(57) ABSTRACT

Provided is a display device, including: a sealing member including an opening and surrounding a space defined by a pair of light transmissive substrates; an end seal for closing the opening of the sealing member to form an encapsulation space; oil filled in the encapsulation space; a spacer for maintaining an interval between the pair of light transmissive substrates; a shutter; a drive portion arranged in the oil, for mechanically driving the shutter; and a wall portion formed on at least one of opposed surfaces of the pair of light transmissive substrates. The wall portion includes apart arranged at a position interrupting a shortest path between the opening of the sealing member and a display region. The wall portion is made of a material forming the spacer, the shutter, and the drive portion.

6 Claims, 7 Drawing Sheets

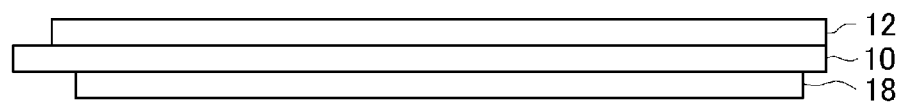
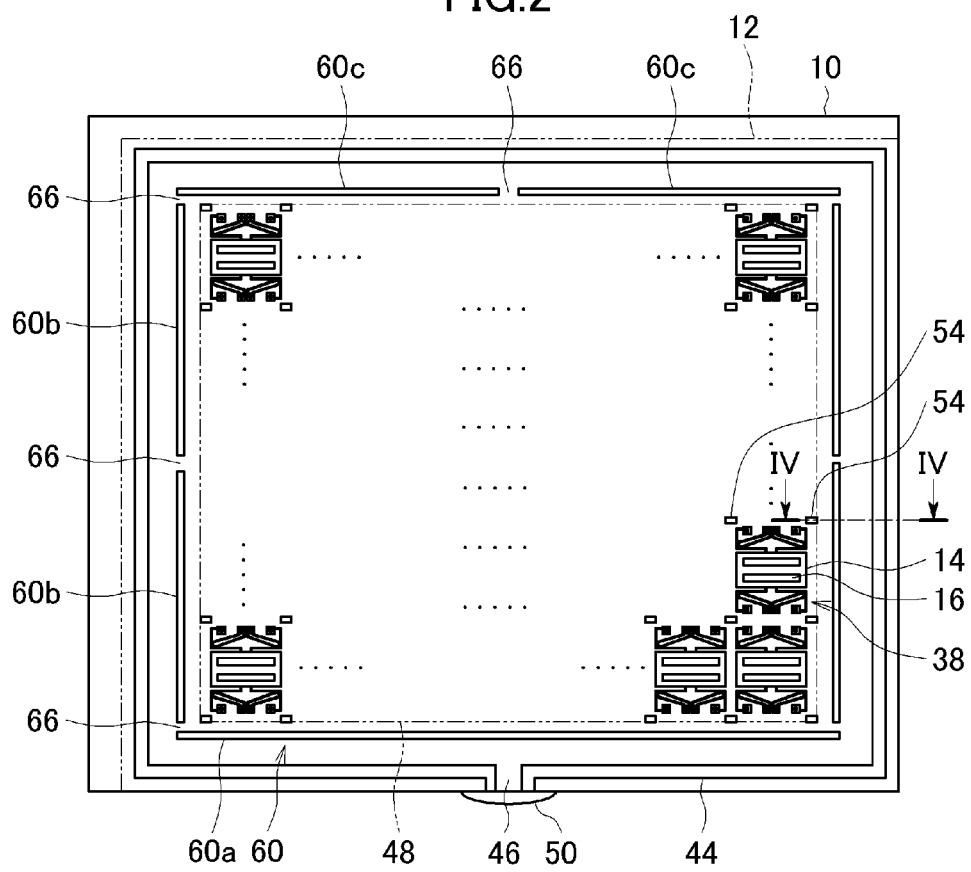

DISPLAY DEVICE AND METHOD FOR MANUFACTURING THE SAME

CROSS-REFERENCE TO RELATED APPLICATION

The present application claims priority from Japanese application JP 2011-124625 filed on Jun. 2, 2011, the contents of which are hereby incorporated by reference into this application.

BACKGROUND OF THE INVENTION

1. Field of the Invention

The present invention relates to a display device and a method of manufacturing the same.

2. Description of the Related Art

A micro-electro-mechanical system (MEMS) display is a display expected to replace a liquid crystal display (see Japanese Patent Application Laid-open No. 2008-197668). This display differs from a liquid crystal shutter type display utilizing polarization, and displays an image by opening and closing a light transmissive window using a mechanical shutter system. A shutter is formed of a thin film. Vertical and horizontal sizes of one shutter forming one pixel are in the order of several hundred micrometers, and a thickness thereof is in the order of several micrometers. One shutter is opened/closed to enable ON/OFF operation for one pixel. The shutter is operated by an electrostatic attractive force.

The shutter is arranged in a space surrounded by a sealing member between a pair of light transmissive substrates, and the space is filled with oil. The oil is used to prevent a spring for driving the shutter from sticking, and to reduce a difference in optical refraction index with respect to the light transmissive substrates.

The oil is injected from an injection port corresponding to an opening of the sealing member, and the injection port is encapsulated by a resin after the oil injection. For high-speed open/close operation of the shutter, oil having low viscosity is desired, but in this case, the speed of oil when passing through the injection port increases to cause a problem of damaging the shutter.

SUMMARY OF THE INVENTION

The present invention has an object to reduce damage on a mechanical shutter when oil is injected to fill a cell in which the mechanical shutter is arranged.

(1) According to an exemplary embodiment of the present invention, there is provided a display device, including: a pair of light transmissive substrates arranged at an interval; a sealing member which is brought into close contact with opposed surfaces of the pair of light transmissive substrates, the sealing member including an opening and surrounding a space defined by the pair of light transmissive substrates; an end seal for closing the opening of the sealing member, thereby encapsulating the space to form an encapsulation space; oil filled in the encapsulation space; a spacer, which is arranged in the oil, for maintaining the interval between the pair of light transmissive substrates; a light shielding film formed on one of the pair of light transmissive substrates, the light shielding film including an aperture portion; a shutter arranged in the oil; a drive portion arranged in the oil, for mechanically driving the shutter so as to control passage and blocking of light through the aperture portion; and a wall portion formed on at least one of the opposed surfaces of the pair of light transmissive substrates. The spacer, the shutter, and the drive portion are arranged in a display region for displaying an image depending on presence/absence and intensity of the light passing through the aperture portion. The wall portion includes a part arranged at a position interrupting a shortest path between the opening of the sealing member and the display region. The wall portion is made of a material forming the spacer, the shutter, and the drive portion. According to the exemplary embodiment of the present invention, when the oil is injected from the opening of the sealing member, the flow of the oil can be weakened by the wall portion, and hence it is possible to reduce the damage on the shutter. Further, the wall portion is made of a material forming the spacer, the shutter, and the drive portion, and hence when those members are simultaneously formed, it is possible to avoid increase of the number of manufacturing steps.

(2) In the display device according to Item (1), the wall portion may be brought into close contact with the opposed surfaces of the pair of light transmissive substrates.

(3) In the display device according to Item (2), the wall portion may be arranged so as to surround the display region, and the wall portion may include a slit formed at a position except for the position interrupting the shortest path.

(4) In the display device according to Item (2), the wall portion may be formed so as to linearly extend between the opening and the display region to pass the position interrupting the shortest path.

(5) In the display device according to Item (4), the wall portion may extend along a plurality of parallel straight lines, and parts of the wall portion extending along the plurality of parallel straight lines, respectively, may each include a slit.

(6) According to an exemplary embodiment of the present invention, there is provided a method of manufacturing a display device, including: assembling an empty cell so as to include: a pair of light transmissive substrates arranged at an interval; a sealing member which is brought into close contact with opposed surfaces of the pair of light transmissive substrates defined by the pair of light transmissive substrates, the sealing member including an opening and surrounding a space; a spacer, which is to be arranged in oil, for maintaining the interval between the pair of light transmissive substrates; a light shielding film formed on one of the pair of light transmissive substrates, the light shielding film including an aperture portion; a shutter arranged in the space; a drive portion arranged in the space, for mechanically driving the shutter so as to control passage and blocking of light through the aperture portion; and a wall portion formed on at least one of the opposed surfaces of the pair of light transmissive substrates, the spacer, the shutter, and the drive portion being arranged in a display region for displaying an image depending on presence/absence and intensity of the light passing through the aperture portion, the wall portion including a part arranged at a position interrupting a shortest path between the opening of the sealing member and the display region; and injecting the oil into the empty cell from the opening of the sealing member. The assembling of the empty cell includes simultaneously forming the spacer, the shutter, the drive portion, and the wall portion in a plurality of processes including forming of a thin film and etching. The injecting of the oil includes injecting the oil from the opening of the sealing member under a state in which an inside of the space is set to have an atmospheric pressure lower than an atmospheric pressure of an outside. According to the exemplary embodiment of the present invention, when the oil is injected from the opening of the sealing member, the flow of the oil can be weakened by the wall portion, and hence it is possible to reduce the damage on the shutter. Further, the wall portion is formed simultaneously when forming the spacer, the shutter, and the drive portion, and hence it is possible to avoid the increase of the number of manufacturing steps.

BRIEF DESCRIPTION OF THE DRAWINGS

In the accompanying drawings:

FIG. 1 is a side view of a display device according to an embodiment of the present invention;

FIG. 2 is a plan view of the display device illustrated in FIG. 1;

DETAILED DESCRIPTION OF THE INVENTION

Hereinafter, an embodiment of the present invention is described with reference to the drawings.

FIG. 1 is a side view of a display device according to the embodiment of the present invention. The display device includes a pair of light transmissive substrates 10 and 12 (for example, glass substrates). The pair of light transmissive substrates 10 and 12 are arranged so as to be opposed to each other at an interval (see FIG. 4). FIG. 2 is a plan view of the display device illustrated in FIG. 1. In FIG. 2, the upper light transmissive substrate 12 is represented by a virtual line to show the inner structure. As illustrated in FIG. 2, a plurality of (large number of) shutters 14 are provided on the lower light transmissive substrate 10.

Figure 3:
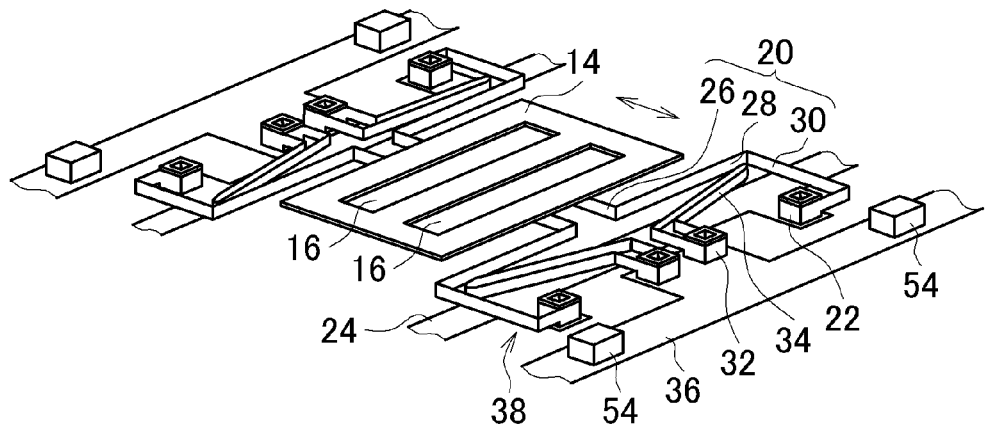
FIG. 3 is a perspective view of a shutter and a drive portion thereof.

FIG. 3 is a perspective view of the shutter 14 and a drive portion thereof. The shutter 14 is made of an inorganic material such as semiconductor or a metal, and is a plate including an aperture portion 16. Light is allowed to pass through the aperture portion 16, and is blocked at a part other than the aperture portion 16. The aperture portion 16 has a shape long in one direction. Note that, as illustrated in FIG. 1, light is supplied from a backlight unit 18 lying under the light transmissive substrate 10.

The shutter 14 is supported by a first spring 20 to be suspended above the light transmissive substrate 10. A plurality of (four in FIG. 2) first springs 20 support the shutter 14. The first spring 20 is fixed to the light transmissive substrate 10 by a first anchor portion 22. Specifically, the first anchor portion 22 is provided on first wiring 24 formed on the light transmissive substrate 10, and the first anchor portion 22 and the first wiring 24 are electrically connected to each other.

The first spring 20 is made of an elastically deformable material, and is arranged so as to be deformable in a direction parallel to the plate surface of the shutter 14. Specifically, the first spring 20 includes a first portion 26 extending in a direction separating from the shutter 14 (direction intersecting (for example, orthogonal to) the length direction of the aperture portion 16), a second portion 28 extending in a direction along the length direction of the aperture portion 16 outwardly from a center of the aperture portion 16 in the length direction, and a third portion 30 further extending in the direction separating from the shutter 14 (direction intersecting (for example, orthogonal to) the length direction of the aperture portion 16). Further, as indicated by the arrows in FIG. 3, the shutter 14 is supported by the first spring 20 so as to be movable in the direction intersecting (for example, orthogonal to) the length direction of the aperture portion 16.

The light transmissive substrate 10 is provided with a second spring 34 supported by a second anchor portion 32. The second anchor portion 32 is provided on second wiring 36 formed on the light transmissive substrate 10, and the second anchor portion 32 and the second wiring 36 are electrically connected to each other. The second spring 34 is opposed to the second portion 28 of the first spring 20 on a side separated from the shutter 14 with respect to the second portion 28. When a voltage is applied to the second anchor portion 32, due to the electrostatic attractive force caused by the potential difference between the second anchor portion 32 and the second portion 28 of the first spring 20, the second portion 28 is attracted toward the second anchor portion 32. When the second portion 28 is attracted, the shutter 14 is also attracted via the first portion 26 provided integrally with the second portion 28. That is, the first spring 20 and the second spring 34 are provided for constituting a drive portion 38 for mechanically driving the shutter 14. The drive portion 38 is also made of an inorganic material such as semiconductor or a metal.

Figure 4:
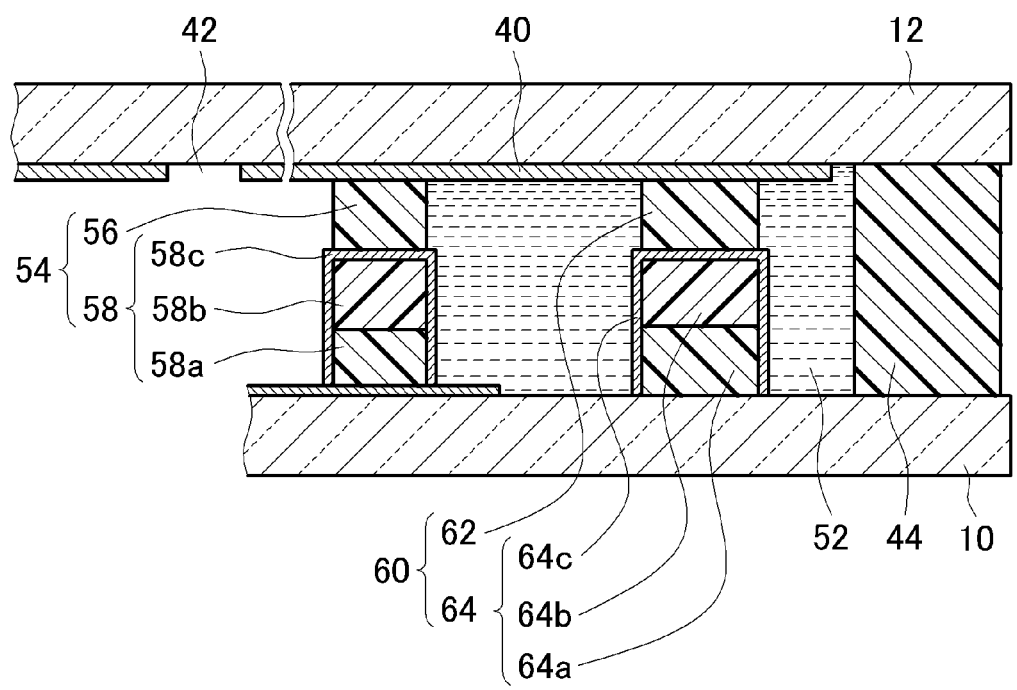
FIG. 4 is an enlarged view of a cross-section taken along the line IV-IV of the display device illustrated in FIG. 2.

FIG. 4 is an enlarged view of a cross-section taken along the line IV-IV of the display device illustrated in FIG. 2. The upper light transmissive substrate 12 has a light shielding film 40 formed thereon. An aperture portion 42 is formed in the light shielding film 40. The above-mentioned aperture portion 16 of the shutter 14 and the aperture portion 42 of the light shielding film 40 are arranged at positions opposed to each other. Light is allowed to pass when both of the aperture portions communicate with each other, and light is blocked when the aperture portion 42 of the light shielding film 40 is covered due to the movement of the shutter 14. In other words, the shutter 14 is mechanically driven so as to control the passage and blocking of light through the aperture portion 42 of the light shielding film 40. One aperture portion 16 and one aperture portion 42 corresponding to each other constitute one pixel, and an image is displayed by a large number of pixels. Therefore, the plurality of (large number of) shutters 14 are provided. The shutters 14 and the drive portions 38 thereof are arranged in a display region (see FIG. 2) which displays an image depending on the presence/absence and intensity of light passing through the aperture portions 16, 42.

As illustrated in FIG. 4, the pair of light transmissive substrates 10 and 12 are fixed at an interval with a sealing member 44. The sealing member 44 is provided in close contact with opposed surfaces of the pair of light transmissive substrates 10 and 12. Further, as illustrated in FIG. 2, the sealing member 44 includes an opening 46 and is formed so as to surround a space defined by the pair of light transmissive substrates 10 and 12. Specifically, the sealing member 44 has a part extending along a rectangular edge surrounding a rectangular display region 48. Note that, the pair of light transmissive substrates 10 and 12 also have a rectangular shape so as to correspond to the rectangular display region 48. An end seal 50 closes the opening 46 of the sealing member 44, thereby encapsulating the space surrounded by the sealing member 44 to form an encapsulation space.

As illustrated in FIG. 4, oil 52 (for example, silicone oil) is filled in the encapsulation space. The shutter 14 and the drive portion 38 are arranged in the oil 52. The oil 52 can suppress vibrations caused by the movement of the shutter 14 and the drive portion 38, and also can prevent sticking of the first spring 20 and the second spring 34. When the light transmissive substrates 10 and 12 are made of glass, with use of the oil 52 having a refractive index close to that of glass, through filling of the oil 52, it is possible to reduce light reflection at an interface of the pair of light transmissive substrates 10 and 12.

The display device includes a spacer 54 for maintaining an interval between the pair of light transmissive substrates 10 and 12. The spacer 54 is arranged in the oil 52 as well, and is arranged in the display region 48 illustrated in FIG. 2. The spacer 54 illustrated in FIG. 4 includes a first spacer portion 56 provided on the upper light transmissive substrate 12, and a second spacer portion 58 provided on the lower light transmissive substrate 10, the first spacer portion 56 and the second spacer portion 58 being bonded to each other. The first spacer portion 56 is made of a resin. The second spacer portion 58 includes two layers of resin portions 58a and 58b, and an inorganic portion 58c which is made of a semiconductor film or a metal film covering the surfaces of the resin portions 58a and 58b.

The display device includes a wall portion 60 formed on at least one of the opposed surfaces of the pair of light transmissive substrates 10 and 12. In the example illustrated in FIG. 4, the wall portion 60 is brought into close contact with the opposed surfaces of the pair of light transmissive substrates 10 and 12. Specifically, the wall portion 60 includes a first wall portion 62 provided on the upper light transmissive substrate 12, and a second wall portion 64 provided on the lower light transmissive substrate 10, the first wall portion 62 and the second wall portion 64 being bonded to each other. The wall portion 60 is made of a material forming the spacer 54, the shutter 14, and the drive portion 38. In the example illustrated in FIG. 4, the first wall portion 62 is made of a resin. The second wall portion 64 includes two layers of resin portions 64a and 64b, and an inorganic portion 64c which is made of a semiconductor film or a metal film covering the surfaces of the resin portions 64a and 64b.

As illustrated in FIG. 2, the wall portion 60 is arranged so as to surround the display region 48. Specifically, the wall portion 60 is arranged on the rectangular edge surrounding the rectangular display region 48. The wall portion 60 has a part arranged at a position interrupting a shortest path between the opening 46 of the sealing member 44 and the display region 48. That is, at least a part of the wall portion 60 is present so as to interrupt a straight-line path between the opening 46 of the sealing member 44 and the display region 48. In other words, at least a part of the wall portion 60 is present between the opening 46 of the sealing member 44 and the display region 48. The wall portion 60 includes slits 66 formed at positions except for the position interrupting the shortest path.

In the example of FIG. 2, the slit is not formed on a straight line of the rectangular edge surrounding the rectangular display region 48, which is provided opposed to the opening 46 of the sealing member 44. The wall portion 60 includes a part 60a extending on the straight line, and a part 60b extending at an interval from the part 60a in an orthogonal direction (direction separating from the opening 46 of the sealing member 44). The slit 66 is formed between the part 60a and the part 60b. Further, the slit 66 is formed in the part 60b itself extending in the direction separating from the opening 46 of the sealing member 44. Further, the slit 66 is also formed between the part 60b extending in the direction separating from the opening 46 of the sealing member 44 and a part 60c formed on a side opposite to the opening 46 of the sealing member 44 across the display region 48 (that is, a corner portion). Further, the slit 66 is formed in the part 60c itself formed on the side opposite to the opening 46 of the sealing member 44 across the display region 48. As described above, the wall portion 60 includes a plurality of slits 66. Through the slits 66, the oil 52 can flow in and out of a region surrounded by the wall portion 60.

Figure 5:
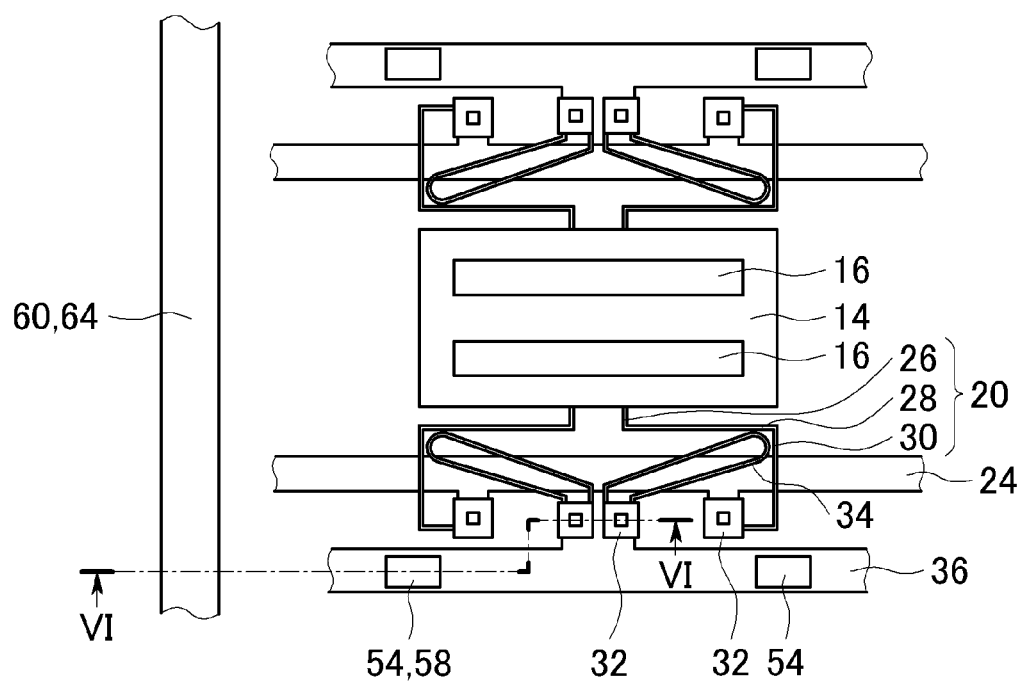
FIG. 5 is a plan view illustrating a part inside an empty cell.
Figure 6:
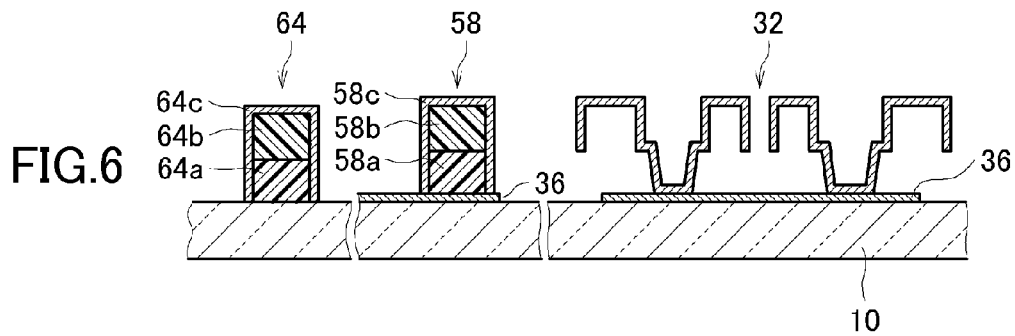
FIG. 6 is a sectional view taken along the line VI-VI of the structure illustrated in FIG. 5.

The display device has a structure in which an empty cell is filled with the oil 52. FIG. 5 is a plan view illustrating a part inside the empty cell. FIG. 6 is a sectional view taken along the line VI-VI of the structure illustrated in FIG. 5. The empty cell includes, as described above, the second wall portion 64, the second spacer portion 58, and the second anchor portion 32, which are provided on the light transmissive substrate 10 arranged on the lower side in FIG. 1. The second anchor portion 32 is made of the same inorganic material (semiconductor or a metal) as the surface layers of the second wall portion 64 and the second spacer portion 58. The second anchor portion 32 has a part which rises three-dimensionally and is suspended from the light transmissive substrate 10. The second wiring 36 is present under the second anchor portion 32, and the second wiring 36 and the second anchor portion 32 are electrically connected to each other. Note that, the second spacer portion 58 is also arranged on the second wiring 36.

FIGS. 7 to 10 are views illustrating a step of forming the second wall portion 64, the second spacer portion 58, and the second anchor portion 32.

Figure 7:
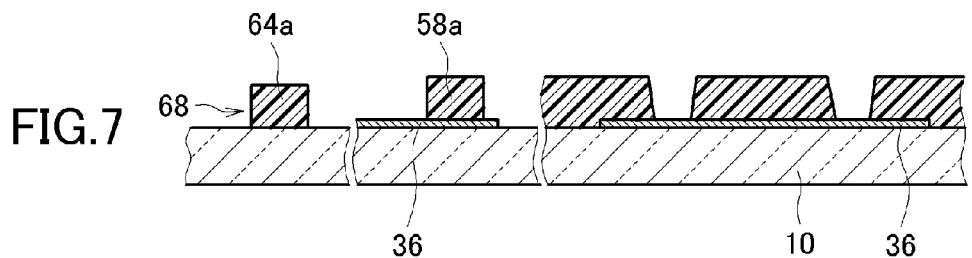
FIG. 7 is a view illustrating a step of forming a second wall portion, a second spacer portion, and a second anchor portion.

As illustrated in FIG. 7, a first resin layer 68 is formed on the light transmissive substrate 10 arranged on the lower side in FIG. 1. For example, a photosensitive resin such as a photoresist is patterned by lithography, and the photosensitive resin is cured by ultraviolet rays or the like to form the first resin layer 68. The first resin layer 68 includes a part forming the lower resin portion 64a of the second wall portion 64 and the lower resin portion 58a of the second spacer portion 58, and a part for shaping a lower part of the second anchor portion 32. The first resin layer 68 is formed so as to be placed on the second wiring 36, and is formed so as to avoid an electrical connection portion between the second anchor portion 32 and the second wiring 36, that is, formed so that a part of the second wiring 36 is exposed.

Figure 8:
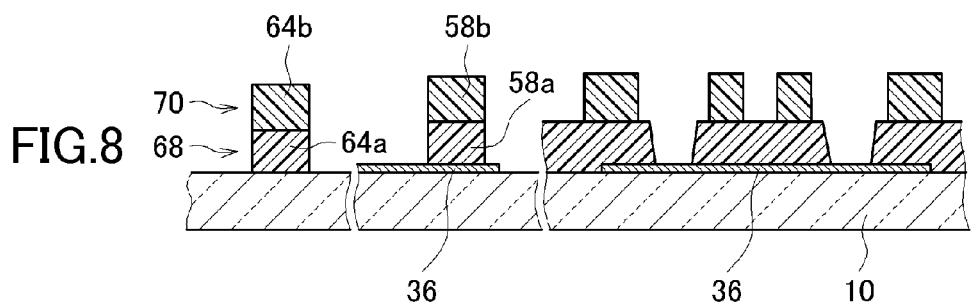
FIG. 8 is a view illustrating the step of forming the second wall portion, the second spacer portion, and the second anchor portion.

As illustrated in FIG. 8, a second resin layer 70 is formed on the first resin layer 68. The second resin layer 70 is also formed by patterning a photosensitive resin such as a photoresist by lithography. The second resin layer 70 includes a part forming the upper resin portion 64b of the second wall portion 64 and the upper resin portion 58b of the second spacer portion 58, and a part for shaping an upper part of the second anchor portion 32. The second resin layer 70 is also formed so as to avoid the electrical connection portion between the second anchor portion 32 and the second wiring 36, that is, formed so that a part of the second wiring 36 is exposed.

Figure 9:
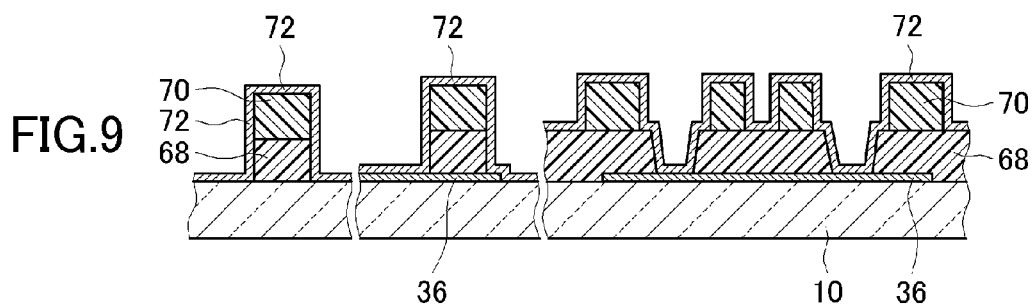
FIG. 9 is a view illustrating the step of forming the second wall portion, the second spacer portion, and the second anchor portion.
Figure 10:
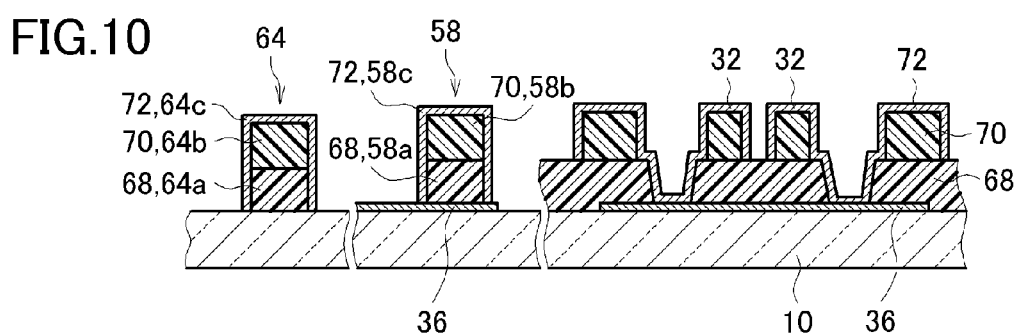
FIG. 10 is a view illustrating the step of forming the second wall portion, the second spacer portion, and the second anchor portion.

As illustrated in FIG. 9, on the light transmissive substrate 10 and the members formed thereon (second wiring 36, first resin layer 68, and second resin layer 70), an inorganic layer 72 (for example, a-SiN/Al film) is formed by chemical vapor deposition (CVD) or sputtering. The inorganic layer 72 is subjected to etching as illustrated in FIG. 10. The inorganic layer 72 may be a single layer or may include a plurality of layers. Through the etching, the inorganic portion 64c of the second wall portion 64, the inorganic portion 58c of the second spacer portion 58, and the second anchor portion 32 are obtained. Further, the first resin layer 68 and the second resin layer 70, which are present below the second anchor portion 32, are removed, and thus the structure illustrated in FIG. 6 is obtained.

With the same process of forming the second anchor portion 32, the shutter 14, the first anchor portion 22, the first spring 20, and the second spring 34 are formed. Further, on the light transmissive substrate 12 on the opposite side, the first wall portion 62 and the first spacer portion 56 are simultaneously formed (see FIG. 4).

With the steps described above, the spacer 54, the shutter 14, the drive portion 38, and the wall portion 60 are simultaneously formed in a plurality of processes including forming of a thin film and etching.

A method of manufacturing the display device according to this embodiment includes the above-mentioned steps, and also includes a subsequent step of assembling the empty cell. The empty cell includes the pair of light transmissive substrates 10 and 12 arranged at an interval, and a structure present therebetween corresponds to the structure of the display device described above except that the oil 52 is absent. That is, the empty cell is in a state before injection of the oil 52.

FIGS. 11 to 14 are views illustrating a step of injecting the oil 52 into the empty cell. In this embodiment, in the step of injecting the oil 52, an inner space is set to have an atmospheric pressure lower than that of the outside, and then the oil 52 is injected from the opening 46 of the sealing member 44.

Figure 12:
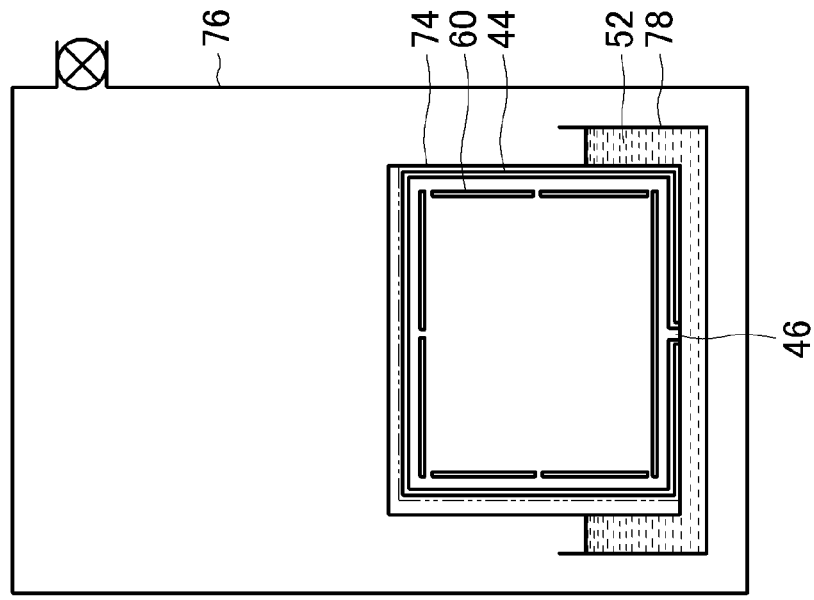
FIG. 12 is a view illustrating the step of injecting the oil into the empty cell.
Figure 11:
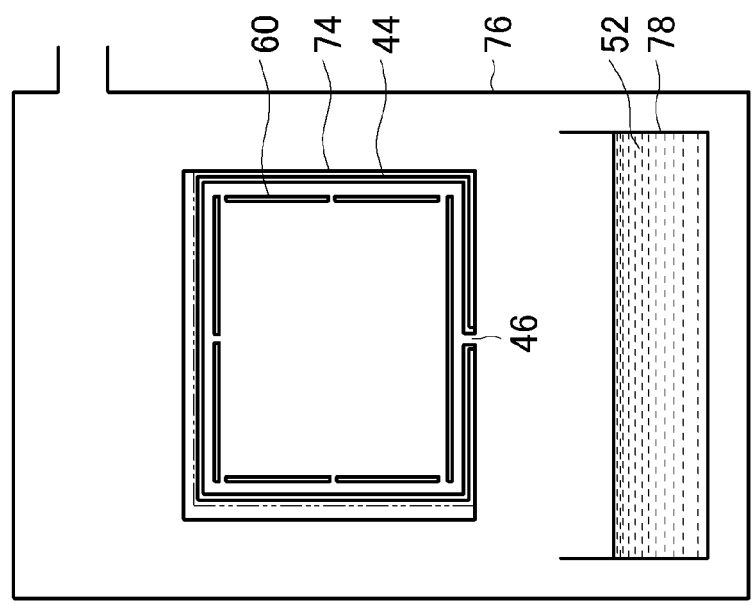
FIG. 11 is a view illustrating a step of injecting oil into the empty cell.
Figure 13:
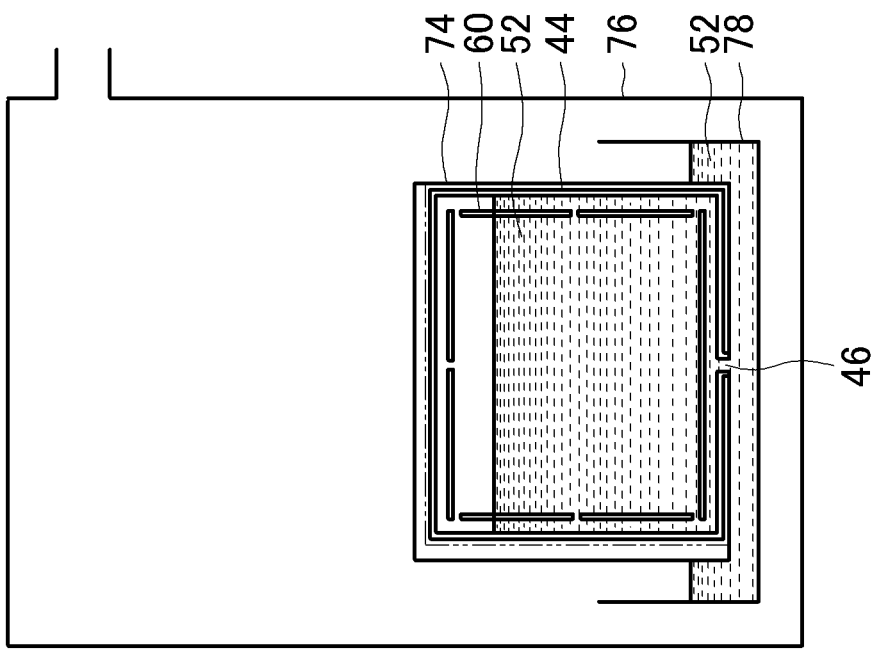
FIG. 13 is a view illustrating the step of injecting the oil into the empty cell.

Specifically, as illustrated in FIG. 11, an empty cell 74 in which the sealing member 44 surrounds an inner space is prepared. Further, in a vacuum chamber 76, a container 78 containing the oil 52 is prepared. As illustrated in FIG. 12, after the inside of the vacuum chamber 76 is set to a vacuum state, the opening 46 (injection port) of the sealing member 44 is brought into contact with the oil 52. As illustrated in FIG. 13, when the hermetically sealed state of the vacuum chamber 76 is released and the air is leaked, the oil 52 is filled into the empty cell 74 (space surrounded by the sealing member 44) from the opening 46 of the sealing member 44. The oil 52 flows faster as the oil 52 has lower viscosity.

Figure 14:
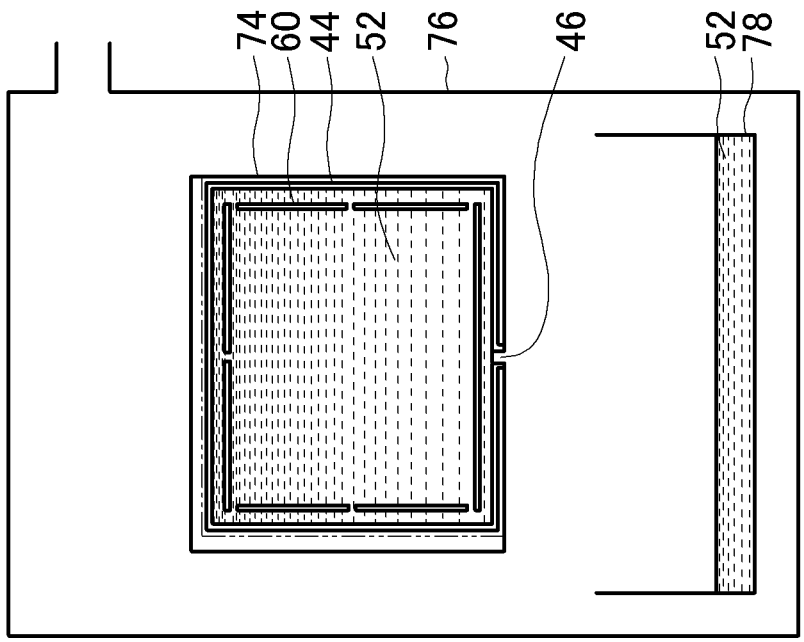
FIG. 14 is a view illustrating the step of injecting the oil into the empty cell.

According to this embodiment, when the oil 52 is injected into the display region 48 from the opening 46 of the sealing member 44, the flow of the oil 52 can be weakened by the wall portion 60, and hence it is possible to reduce damage on the shutter 14 (see FIG. 2) arranged in the display region 48. Further, the wall portion 60 is simultaneously formed with the spacer 54, the shutter 14, and the drive portion 38, and hence it is possible to avoid increase in the number of manufacturing steps. In this manner, the oil 52 is filled as illustrated in FIG. 14. After that, as illustrated in FIG. 2, the opening 46 is closed with the end seal 50.

Figure 15:
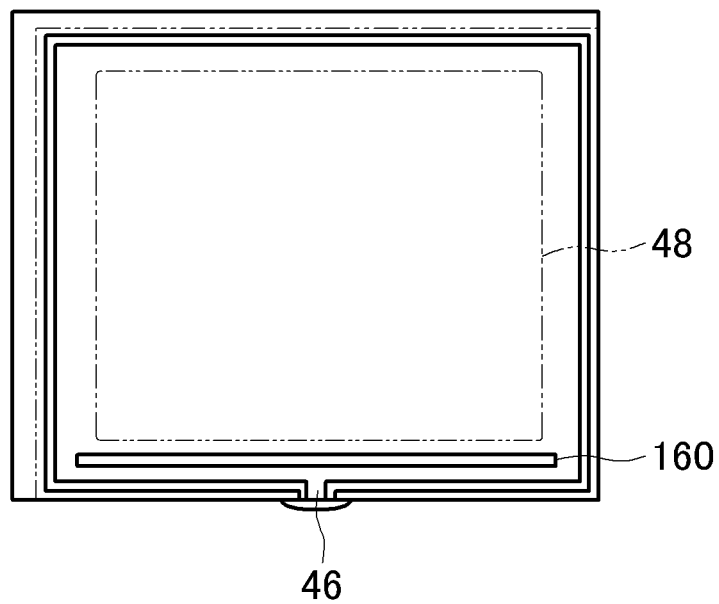
FIG. 15 is a view illustrating a modified example of the display device according to the embodiment of the present invention.
Figure 16:
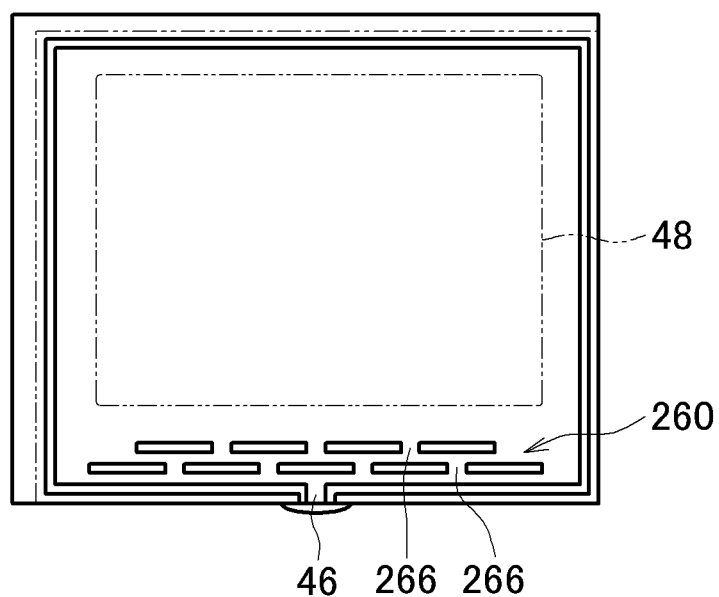
FIG. 16 is a view illustrating another modified example of the display device according to the embodiment of the present invention.

FIGS. 15 and 16 are views illustrating modified examples of the display device according to the embodiment of the present invention.

In the example illustrated in FIG. 15, a wall portion 160 is formed so as to linearly extend between the opening 46 and the display region 48 to pass a position interrupting the shortest path. The wall portion 160 is formed only at this position, and does not surround the display region 48. At least the oil 52 (see FIG. 14) flowing in from the opening 46 hits the wall portion 160 before flowing into the display region 48, and hence the above-mentioned effect can be achieved. Further, the wall portion 160 is formed continuously with a length exceeding the width of the display region 48. Therefore, the oil 52 flows around from the lateral side of the display region 48, with the result that the flow path is set longer to decrease the flow velocity.

In the example illustrated in FIG. 16, a wall portion 260 extends along a plurality of parallel straight lines, and parts of the wall portion 260 extending along the respective straight lines include slits 266. The slits 266 are formed in a staggered manner, and hence the oil 52 (see FIG. 14) flows in a zigzag manner. With this, the flow path of the oil 52 can be set longer to decrease the flow velocity. While there have been described what are at present considered to be certain embodiments of the invention, it will be understood that various modifications may be made thereto, and it is intended that the appended claims cover all such modifications as fall within the true spirit and scope of the invention.

What is claimed is:

1. A display device, comprising:
    a pair of light transmissive substrates arranged at an interval;
    a sealing member which is brought into close contact with opposed surfaces of the pair of light transmissive substrates, the sealing member comprising an opening and surrounding a space defined by the pair of light transmissive substrates;
    an end seal for closing the opening of the sealing member, thereby encapsulating the space to form an encapsulation space;
    oil filled in the encapsulation space;
    a spacer, which is arranged in the oil, for maintaining the interval between the pair of light transmissive substrates;
    a light shielding film formed on one of the pair of light transmissive substrates, the light shielding film comprising an aperture portion;
    a shutter arranged in the oil;
    a drive portion arranged in the oil, for mechanically driving the shutter so as to control passage and blocking of light through the aperture portion; and
    a wall portion formed on at least one of the opposed surfaces of the pair of light transmissive substrates,
    wherein the spacer, the shutter, and the drive portion are arranged in a display region for displaying an image depending on presence/absence and intensity of the light passing through the aperture portion,
    wherein the wall portion comprises a part arranged at a position interrupting a shortest path between the opening of the sealing member and the display region, and
    wherein the wall portion is made of a material forming the spacer, the shutter, and the drive portion.

2. The display device according to claim 1, wherein the wall portion is brought into close contact with the opposed surfaces of the pair of light transmissive substrates.

3. The display device according to claim 2,
    wherein the wall portion is arranged so as to surround the display region, and
    wherein the wall portion comprises a slit formed at a position except for the position interrupting the shortest path.

4. The display device according to claim 2, wherein the wall portion is formed so as to linearly extend between the opening and the display region to pass the position interrupting the shortest path.

5. The display device according to claim 4, wherein the wall portion extends along a plurality of parallel straight lines, and parts of the wall portion extending along the plurality of parallel straight lines, respectively, each comprise a slit.

6. A method of manufacturing a display device, comprising:
- assembling an empty cell so as to comprise:
  - a pair of light transmissive substrates arranged at an interval;
  - a sealing member which is brought into close contact with opposed surfaces of the pair of light transmissive substrates, the sealing member comprising an opening and surrounding a space defined by the pair of light transmissive substrates;
  - a spacer, which is to be arranged in oil, for maintaining the interval between the pair of light transmissive substrates;
  - a light shielding film formed on one of the pair of light transmissive substrates, the light shielding film comprising an aperture portion;
  - a shutter arranged in the space;
  - a drive portion arranged in the space, for mechanically driving the shutter so as to control passage and blocking of light through the aperture portion; and
  - a wall portion formed on at least one of the opposed surfaces of the pair of light transmissive substrates,
    - the spacer, the shutter, and the drive portion being arranged in a display region for displaying an image depending on presence/absence and intensity of the light passing through the aperture portion,
    - the wall portion comprising a part arranged at a position interrupting a shortest path between the opening of the sealing member and the display region; and
- injecting the oil into the empty cell from the opening of the sealing member,
- wherein the assembling of the empty cell comprises simultaneously forming the spacer, the shutter, the drive portion, and the wall portion in a plurality of processes comprising forming of a thin film and etching, and
- wherein the injecting of the oil comprises injecting the oil from the opening of the sealing member under a state in which an inside of the space is set to have an atmospheric pressure lower than an atmospheric pressure of an outside.

* * * * *